US010847554B2

(12) United States Patent
Fu et al.

(10) Patent No.: US 10,847,554 B2
(45) Date of Patent: Nov. 24, 2020

(54) METHOD FOR FABRICATING ARRAY SUBSTRATE MOTHERBOARD, ARRAY SUBSTRATE MOTHERBOARD AND DETECTION METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Fangbin Fu, Beijing (CN); Huibin Guo, Beijing (CN); Shoukun Wang, Beijing (CN); Hao Han, Beijing (CN); Yongzhi Song, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/331,766

(22) PCT Filed: May 2, 2018

(86) PCT No.: PCT/CN2018/085276
§ 371 (c)(1),
(2) Date: Mar. 8, 2019

(87) PCT Pub. No.: WO2019/001133
PCT Pub. Date: Jan. 3, 2019

(65) Prior Publication Data
US 2019/0363111 A1 Nov. 28, 2019

(30) Foreign Application Priority Data
Jun. 27, 2017 (CN) .......................... 2017 1 0499346

(51) Int. Cl.
*H01L 29/04* (2006.01)
*H01L 31/036* (2006.01)
(Continued)

(52) U.S. Cl.
CPC .......... *H01L 27/1288* (2013.01); *G01B 11/14* (2013.01); *G06T 7/0006* (2013.01);
(Continued)

(58) Field of Classification Search
CPC . H01L 27/1288; H01L 21/0274; G01B 11/14; G06T 7/0006
(Continued)

(56) References Cited

U.S. PATENT DOCUMENTS

2009/0219258 A1* 9/2009 Geaghan .................. G06F 3/045
345/173
2014/0152579 A1* 6/2014 Frey ........................ G06F 3/041
345/173

FOREIGN PATENT DOCUMENTS

CN  101078832 A  11/2007
CN  101520599 A  9/2009
(Continued)

OTHER PUBLICATIONS

International Search Report and Written Opinion of the International Searching Authority (with English language translation of Written Opinion), International Application No. PCT/CN2018/085276, dated Jul. 31, 2018, 13 pp.
(Continued)

*Primary Examiner* — David S Blum
(74) *Attorney, Agent, or Firm* — Myers Bigel, P.A.

(57) ABSTRACT

A method for fabricating an array substrate motherboard, an array substrate motherboard and a detection method are provided. The method for fabricating an array substrate motherboard includes depositing a first film on a substrate,
(Continued)

wherein a first gap is present between the edge of the first film and the edge of the substrate, coating photoresist on the substrate on which the first film is deposited, and exposing and developing the photoresist to form a first scale pattern from the photoresist. One end of the first scale pattern is flush with the edge of the substrate and the other end covers the first film.

13 Claims, 3 Drawing Sheets

(51) Int. Cl.
*H01L 21/4763* (2006.01)
*H01L 27/12* (2006.01)
*G01B 11/14* (2006.01)
*G06T 7/00* (2017.01)
*H01L 21/027* (2006.01)
*G03F 7/16* (2006.01)
*G03F 7/20* (2006.01)
*G03F 7/26* (2006.01)

(52) U.S. Cl.
CPC ............ *H01L 21/0274* (2013.01); *G03F 7/16* (2013.01); *G03F 7/20* (2013.01); *G03F 7/26* (2013.01); *G06T 2207/30148* (2013.01)

(58) Field of Classification Search
USPC .............................................. 257/72; 438/622
See application file for complete search history.

(56) References Cited

FOREIGN PATENT DOCUMENTS

| CN | 101661220 A | 3/2010 |
| CN | 101980071 A | 2/2011 |
| CN | 104637395 A | 5/2015 |
| CN | 107039305 A | 8/2017 |
| CN | 107195639 A | 9/2017 |

OTHER PUBLICATIONS

First Office Action and English language translation, CN Application No. 201710499346.4, dated May 5, 2019, 13 pp.

* cited by examiner

US 10,847,554 B2

METHOD FOR FABRICATING ARRAY SUBSTRATE MOTHERBOARD, ARRAY SUBSTRATE MOTHERBOARD AND DETECTION METHOD

CROSS REFERENCE TO RELATED APPLICATIONS

The present application is a 35 U.S.C. 371 national stage application of PCT International Application No. PCT/CN2018/085276, filed on May 2, 2018, which claims the benefit of Chinese Patent Application No. 201710499346.4, filed on Jun. 27, 2017, the contents of which are incorporated herein by reference in their entireties. The above-referenced PCT International application was published in the Chinese language as International publication No. WO 2019/001133 A1 Jan. 3, 2019.

TECHNICAL FIELD

The present disclosure relates to the field of display technologies, and particularly to a method for fabricating an array substrate motherboard, an array substrate motherboard and a detection method.

BACKGROUND

An array substrate motherboard usually forms a gate, a source and drain electrode, a thin film transistor, a pixel electrode and other array patterns on an array substrate through multiple patterning processes. Different array patterns need to deposit different films through patterning processes, specifically comprising depositing a metal or a metal oxide film through a PVD (physical vapor deposition) method and depositing a single crystal, a polycrystalline or a compound film through a CVD (chemical vapor deposition) method. Because both PVD and CVD equipment have process limits, a certain distance is present between the edge of the film deposited through the PVD or CVD process and the edge of the array substrate motherboard. In addition, a distance between the edge of the film deposited through the CVD process and the edge of the array substrate motherboard is larger than a distance between the edge of the film deposited through the PVD process and the edge of the array substrate motherboard.

Due to such factors as the failure of PVD or CVD equipment, position deviation of array substrate motherboard in PVD or CVD equipment, the film deposited on the array substrate motherboard through the PVD or CVD process has a relatively large deviation. As a result, the distance between the edge of the film deposited through the PVD or CVD process and the edge of the array substrate motherboard is relatively large, so that an array pattern would not be formed at a position adjacent to the edge of the array substrate motherboard, which results in bad performance of the array substrate motherboard. In order to monitor the distance between the edge of the film deposited through the PVD or CVD process and the edge of the array substrate motherboard, the distance between the edge of the deposited film and the edge of the array substrate motherboard is measured manually by using a graduated scale to determine whether the position of the deposited film is deviated from the array substrate motherboard or not. There is room for improvement in this monitoring method.

SUMMARY

The present disclosure provides a method for fabricating an array substrate motherboard, comprising:

depositing a first film on a substrate, wherein a first gap is present between an edge of the first film and an edge of the substrate;

coating a photoresist on the substrate on which the first film is deposited;

exposing and developing the photoresist to form a first scale pattern by the photoresist, wherein one end of the first scale pattern is flush with the edge of the substrate and the other end covers the first film.

In one or more embodiments, the first film is a metallic film.

In one or more embodiments, in the steps of exposing and developing the photoresist, a first photolithographic pattern is formed by the photoresist while the first scale pattern is formed by the photoresist.

In one or more embodiments, the first photolithographic pattern is positioned in a display area of the substrate.

In one or more embodiments, after the first scale pattern and the first photolithographic pattern are formed by the photoresist, the method further comprises:

removing the first film which is not covered by the first scale pattern and the first photolithographic pattern by etching, and stripping the first scale pattern and the first photolithographic pattern to form a second scale pattern and a first pattern.

In one or more embodiments, the first pattern is a gate pattern.

In one or more embodiments, after the second scale pattern and the first pattern are formed, the method further comprises:

depositing a second film on a surface of the substrate on which the second scale pattern and the first pattern are formed, wherein a second gap is present between the edge of the second film and the edge of the substrate, the second gap is larger than the first gap, and the second film partially covers the second scale pattern.

In one or more embodiments, the second film is a non-metallic film.

In one or more embodiments, both the first scale pattern and the second scale pattern comprise a plurality of scale lines, and the plurality of scale lines are arranged at equal intervals along a direction perpendicular to the edge of the substrate.

In one or more embodiments, the distance between two adjacent scale lines is 1-20 µm.

In one or more embodiments, both the first scale pattern and the second scale pattern further comprise a plurality of scale values, and the plurality of scale values are respectively arranged at a side of the plurality of scale lines.

In one or more embodiments, the scale value corresponding to the scale line which is flush with the edge of the substrate is 0.

The present disclosure further provides an array substrate motherboard, comprising a substrate and a scale pattern on the substrate, wherein a gap is present between an edge of the scale pattern and an edge of the substrate.

In one or more embodiments, the scale patterns are multiple and are uniformly distributed around the substrate.

In one or more embodiments, the scale pattern comprises a plurality of scale lines, and the plurality of scale lines are arranged at equal intervals along a direction perpendicular to the edge of the substrate.

In one or more embodiments, the distance between two adjacent scale lines is 1-20 µm.

In one or more embodiments, the scale pattern further comprises a plurality of scale values, and the plurality of scale values are respectively arranged at a side of the plurality of scale lines.

In one or more embodiments, a display area of the substrate comprises a gate pattern, and the scale pattern is arranged in a same layer as the gate pattern.

The present disclosure further provides a method for detecting an array substrate motherboard, wherein the array substrate motherboard comprises a substrate and a scale pattern on the substrate, wherein a gap is present between an edge of the scale pattern and an edge of the substrate, and wherein the detection method comprises:

acquiring an image of the scale pattern; and determining a distance between the edge of the film covering the scale pattern and the edge of the substrate according to the image of the scale pattern.

DETAILED DESCRIPTION

In order to enable those skilled in the art to better understand the technical solutions of the present disclosure, a method for fabricating an array substrate motherboard, an array substrate motherboard and a detection method provided by the present disclosure are described in detail hereinafter with reference to the accompanying drawings.

The inventors find the following problems in current monitoring method. Firstly, a position deviation of films deposited through PVD process and CVD process is usually dozens of microns, while a minimum scale of a manually-measured graduated scale is millimeter-level. Therefore, the measuring deviation is large and the precision is low. Secondly, manually measuring the distance between the edge of a film deposited through PVD or CVD process and the edge of an array substrate motherboard takes a long time and is time consuming and labor consuming. Therefore, the present disclosure provides a method for fabricating an array substrate motherboard, an array substrate motherboard and a detection method.

Figure 1:
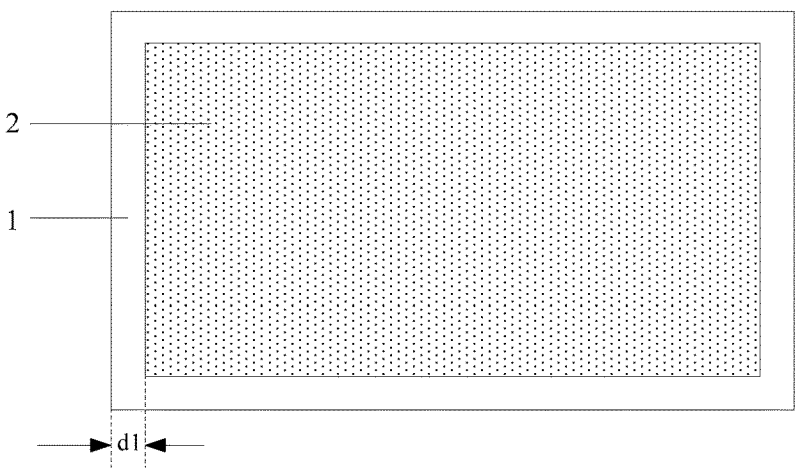
FIG. 1 is a schematic structural diagram of an array substrate motherboard according to an embodiment of the present disclosure.

An embodiment of the present disclosure provides a method for fabricating an array substrate motherboard, and as shown in FIGS. 1 to 4, the method for fabricating an array substrate motherboard comprises the following steps:

Step 1, depositing a first film 2 on a substrate 1, wherein a first gap d1 is present between an edge of the first film 2 and an edge of the substrate 1, as shown in FIG. 1.

Specifically, the first film 2 is located in the middle of the substrate 1. The material of the first film 2 is metal or metal oxide, such as copper, aluminum or indium tin oxide. In an alternative embodiment, the material of the first film 2 is single crystal, polycrystalline or compound, such as amorphous silicon, silicon nitride or silicon oxide.

In the context of the present disclosure, the existence of a gap between the edge of the film and the edge of the substrate refers to that the deposited film does not completely cover the substrate, and the gap refers to an edge area of the substrate that is not covered by the film. As an example, the gap is characterized by its width or length.

Figure 2:
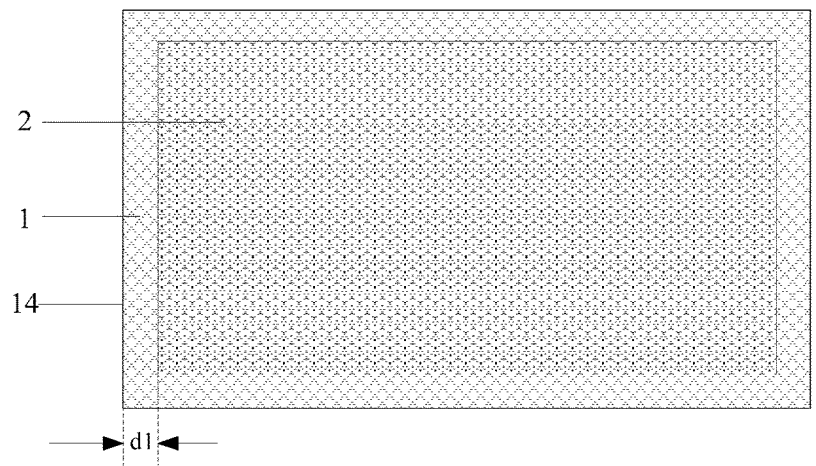
FIG. 2 is a schematic structural diagram of an array substrate motherboard according to an embodiment of the present disclosure.

Step 2, coating a photoresist 14 on the first film 2, as shown in FIG. 2.

Specifically, the photoresist 14 is coated on the surface of the substrate 1 and the first film 2, and the photoresist 14 completely covers the first film 2 and covers the edges of the substrate 1. The edges of the photoresist 14 are flush with the edges of the substrate 1.

Figure 3:
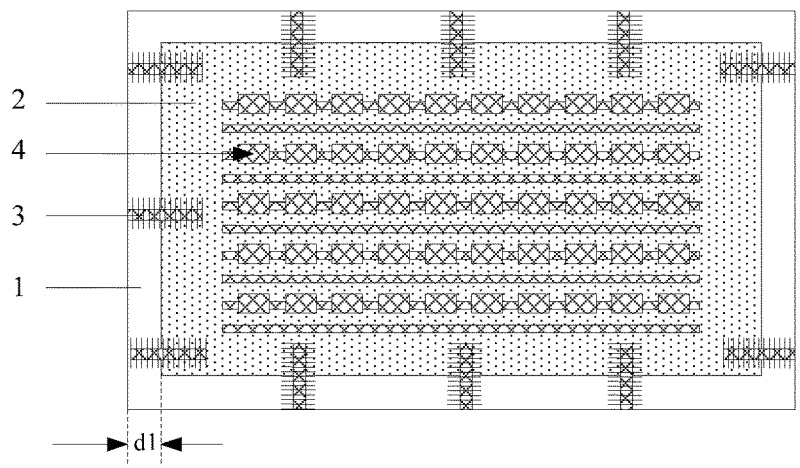
FIG. 3 is a schematic structural diagram of an array substrate motherboard according to an embodiment of the present disclosure.

Step 3, exposing and developing the photoresist 14 to form a first scale pattern 3 by a photoresist 14, and one end of the first scale pattern 3 is flush with the edge of the substrate 1 and the other end covers the first film 2, as shown in FIG. 3.

Specifically, a mask plate is used for exposing the photoresist 14 and a first mask plate pattern corresponding to the first scale pattern 3 is arranged on the edge of the mask plate. After developing, the photoresist 14 forms the first scale pattern 3. The first scale pattern 3 (specifically, its length direction or extension direction) is perpendicular to the edge of the first film 2, and an projection of the first scale pattern 3 on the substrate 1 partially overlaps with an projection of the first film 2 on the substrate 1. As shown in FIG. 3, the first scale pattern 3 is integrally strip-shaped.

As shown in FIG. 3, the first scale pattern 3 is more than one. For example, these first scale patterns 3 are uniformly distributed around the substrate 1. Thus, distances between the edges of the first film 2 and the edges of the substrate 1 would be read out through the first scale patterns 3 at different positions, so as to obtain relative deviation between the first film 2 and the substrate 1.

Figure 4:
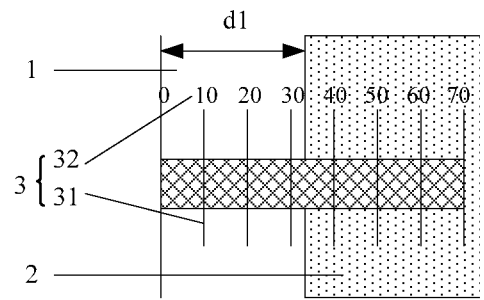
FIG. 4 is a partial enlarged drawing of a first scale pattern according to an embodiment of the present disclosure.

As shown in FIG. 4, the first scale pattern 3 for example comprises: a plurality of first scale lines 31 and a plurality of first scale values 32. The first scale lines 31 are arranged at equal intervals along a direction perpendicular to the edge of the substrate 1. The first scale values 32 correspond to the first scale lines 31. As shown, the first scale values 32 are arranged, for example, on the side of each first scale lines 31. For example, the first scale value 32 corresponding to the first scale line 31 which is flush with the edge of the substrate 1 is 0. Thus, the distance between the edge of the first film 2 and the edge of the substrate 1 is read out directly through the first scale values 32.

As described above, after exposure and development, the first scale pattern 3 is formed by the photoresist 14. One end of the first scale pattern 3 is flush with the edge of the substrate 1, and the other end covers the first film 2. As shown in FIG. 4, the distance of the first gap d1 between the edge of the first film 2 and the edge of the substrate 1 is read out through the first scale pattern 3. Compared with a manual measuring method, the measuring efficiency of this method is higher, and time and labor are saved. Moreover, the precision of the first scale pattern 3 formed by photolithography process is micron-level, and compared with a millimeter-level graduated scale, the measuring precision is higher and the measuring deviation is smaller.

For example, as shown in FIG. 3, the photoresist 14 further forms a first photolithographic pattern 4 when the photoresist 14 on the substrate 1 is exposed and developed. The first photolithographic pattern 4 and the first scale pattern 3 are synchronously formed and are located in the display area of the substrate 1. In other words, a second mask plate pattern corresponding to the first photolithographic pattern 4 is arranged in the middle position of a mask plate, and a first mask plate pattern corresponding to the first scale pattern 3 is arranged at the edge position of the mask plate. After developing, the photoresist synchronously forms the first scale pattern 3 and the first photolithographic pattern 4. The first photolithographic pattern 4 and the first scale pattern 3 are synchronously formed through one mask plate. This fabricating method is simple and relatively low in cost.

It should be noted that the first photolithographic pattern 4 is, for example, a gate photolithographic pattern (that is, a patterned photoresist with the same pattern as the gate to be formed), a source and drain photolithographic pattern, an active layer photolithographic pattern, an insulating layer photolithographic pattern or a pixel electrode photolithographic pattern.

Figure 5:
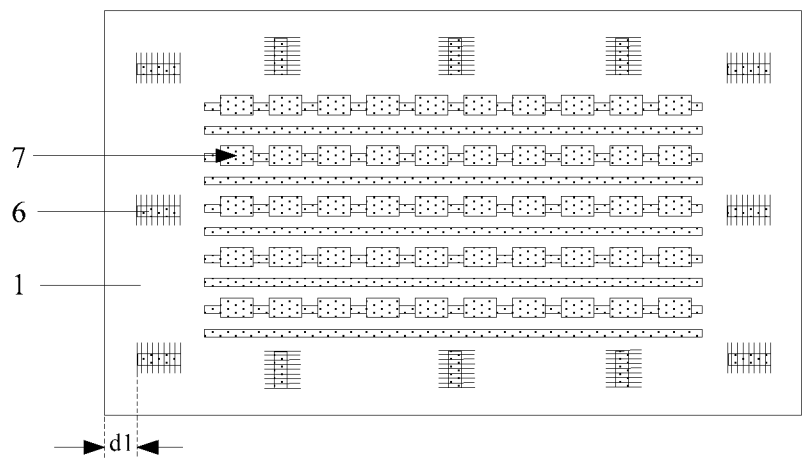
FIG. 5 is a schematic structural diagram of an array substrate motherboard according to an embodiment of the present disclosure.

As shown in FIG. 5, after the photoresist 14 forms the first scale pattern 3 and the first photolithographic pattern 4, the method, for example, further comprises:

Step 4, removing a first film 2 which is not covered by a first scale pattern 3 and a first photolithographic pattern 4 by etching, and stripping the first scale pattern 3 and the first photolithographic pattern 4, so that a second scale pattern 6 and a first pattern 7 are formed by the first film 2.

Specifically, the first film 2 which is not covered by the first scale pattern 3 and the first photolithographic pattern 4 is removed by the etching process. Correspondingly, after etching, the first film 2 which is covered by the first scale pattern 3 forms the second scale pattern 6, and the first film 2 which is covered by the first photolithographic pattern 4 forms the first pattern 7. After the second scale pattern 6 and the first pattern 7 are formed by the first film 2, the first scale pattern 3 and the first photolithographic pattern 4 can be stripped from the surface of the first film 2 by using a stripping solution, namely removing the photoresist on the first film 2.

It should be noted that the etching process comprises dry etching and wet etching. When the material of the first film 2 is metal or metal oxide, the first film 2 is usually etched by wet etching. As an example of wet etching, acid solution is used for etching the first film 2. When the material of the first film 2 is single crystal, polycrystalline or compound, the first film 2 is usually etched by dry etching. As an example of dry etching, plasma is used for etching the first film 2.

Figure 6:
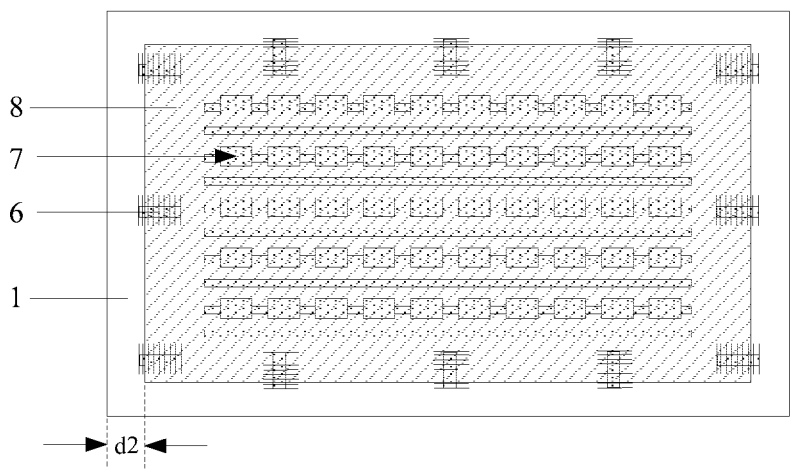
FIG. 6 is a schematic structural diagram of an array substrate motherboard according to an embodiment of the present disclosure.
Figure 7:
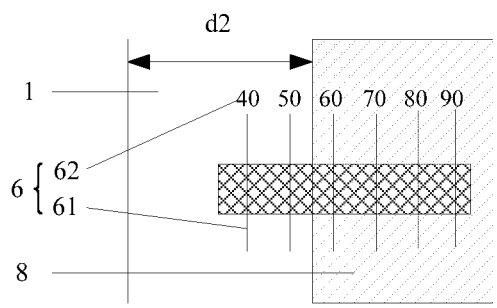
FIG. 7 is a partial enlarged drawing of a second scale pattern according to an embodiment of the present disclosure.

As shown in FIGS. 6 and 7, after the first film 2 forms the second scale pattern 6 and the first pattern 7, for example, a second film 8 is deposited on the surface of the second scale pattern 6, the first pattern 7 and the substrate 1. A second gap d2 is present between the edge of the second film 8 and the edge of the substrate 1, and the second gap d2 is larger than the first gap d1. When the second film 8 partially covers the second scale pattern 6, the distance of the second gap d2 between the edge of the second film thin 8 and the substrate 1 can be read out through the second scale pattern 6.

Specifically, as shown in FIG. 7, the second scale pattern 6 comprises: a plurality of second scale lines 61 and a plurality of second scale values 62. The second scale lines 61 are arranged at equal intervals along a direction perpendicular to the edge of the substrate 1. The second scale values 62 correspond to the second scale lines 61. As shown, the second scale values 62 are arranged, for example, on one side of each second scale lines 61. Thus, the distance between the edge of the second film 8 and the edge of the substrate 1 is read out directly through the second scale values 62. As shown in FIG. 5, the second scale pattern 6 is integrally strip-shaped.

Since a gate pattern is firstly formed on the substrate 1, the first pattern 7 is, for example, a gate pattern. That is, the gate pattern and the second scale pattern 6 are synchronously formed on the substrate 1. In this way, the distances between the edges of each layer of the films deposited later and the edge of the substrate 1 would be read out by the second scale pattern 6.

It should be noted that after the gate pattern and the second scale pattern 6 are synchronously formed on the substrate 1, the second film 8 deposited subsequently is, for example, metal or metal oxide, or single crystal, polycrystalline or compound. When the second film 8 deposited subsequently is metal or metal oxide, steps 2 and 3 need to be performed. Namely, in the process of forming the photolithographic pattern corresponding to the second film 8, a corresponding scale pattern is additionally formed by the photoresist, and the distance between the edge of the second film 8 and the edge of the substrate 1 is read out through the additionally formed scale pattern.

When the second film 8 deposited subsequently is single crystal, polycrystalline or compound, because the second scale pattern 6 is formed synchronously with the gate pattern, the material of the corresponding second scale pattern 6 is metal, and the distance between the edge of the metallic film and the edge of the substrate 1 is smaller than the distance between the edge of the non-metallic film and the edge of the substrate 1. Therefore, the second film 8 partially covers the second scale pattern 6, thereby exposing part of the second scale pattern 6. Namely, the distance between the edge of the second film 8 and the edge of the substrate 1 can be read out through the second scale pattern 6. In this way, in the subsequent process of forming the photolithographic pattern corresponding to the second film 8, a corresponding scale pattern does not need to be additionally formed by the photoresist. The space of the substrate 1 occupied by the scale pattern is reduced, and the utilization rate of the substrate 1 is increased.

An embodiment of the present disclosure provides an array substrate motherboard, comprising a substrate and a scale pattern on the substrate, wherein a gap is present between an edge of the scale pattern and an edge of the substrate. The scale pattern herein may be a second scale pattern 6 formed by a first film 2, as described below with FIGS. 6 and 7, and may also be a first scale pattern 3 formed by a photoresist as described in FIGS. 3 and 4.

In an exemplary embodiment, as shown in FIGS. 6 and 7, the array substrate motherboard comprises a second scale pattern 6. The second scale pattern 6 is arranged on a substrate 1, and a second gap d2 is present between the edge of the second scale pattern 6 and the edge of the substrate 1.

Specifically, the second scale pattern 6 comprises a plurality of second scale lines 61 and a plurality of second scale values 62. The second scale lines 61 are arranged at equal intervals along a direction perpendicular to the edge of the substrate 1, and the second scale values 62 correspond to the second scale lines 61. The distance between the adjacent second scale lines 61 is the minimum scale value. For example, the minimum scale value is 1-20 μm.

According to the array substrate motherboard provided by the embodiments of the present disclosure, after the second scale pattern 6 is partially covered by the second film 8, the distance of the second gap d2 between the edge of the second film 8 and the edge of the substrate 1 is read out by the second scale value 62 according to a relative position of the edge of the second film 8 with respect to the second scale line 61. Compared with a manual measuring method, the measuring efficiency is higher, and time and labor are saved. Moreover, the minimum scale value of the second scale pattern 6 is micron-level. Compared with a millimeter-level graduated scale, the measuring precision is higher and the measuring deviation is smaller.

When the range of the second scale pattern 6 is larger, the second scale pattern 6 occupies a larger space of the substrate 1. When the range of the second scale pattern 6 is smaller, the second film 8 may not be able to cover the second scale pattern 6. Therefore, the range of the second scale pattern 6 needs to be determined according to actual conditions.

As shown in FIG. 6, the second scale pattern 6 is more than one. For example, the second scale patterns 6 are uniformly distributed around the substrate 1. In this way, the distance between the edge of the second film 8 which partially covers the second scale pattern 6 and the edge of the substrate 1 can be read out by the second scale patterns 6 at different positions, and the relative deviation between the second film 8 and the substrate 1 would be obtained.

It should be noted that a display area of substrate 1 may further comprise a gate pattern, an active layer pattern, a source and drain electrode pattern, a pixel electrode pattern and a common electrode pattern. For example, the second scale pattern 6 is arranged in a same layer as the gate pattern.

As shown in FIGS. 3 and 4, for example, the first scale value 32 corresponding to the first scale line 31 which is flush with the edge of the substrate 1 is 0. Thus, the distance between the edge of the first film 2 and the edge of the substrate 1 would be read out directly through the first scale value 32.

Figure 8:
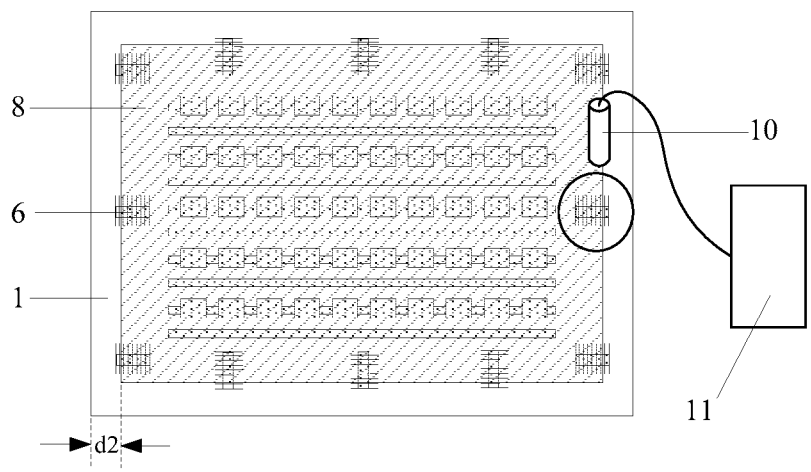
FIG. 8 is a schematic diagram of a detection method according to an embodiment of the present disclosure.

An embodiment of the present disclosure provides a detection method, which is applied to an array substrate motherboard provided in the embodiments described with FIGS. 6 and 7. As shown in FIG. 8, the detection method is used for detecting a position of a second film 8 formed on a second scale pattern 6, wherein the second film 8 partially covers the second scale pattern 6. The method comprises the following steps:

Step 1, acquiring an image of the second scale pattern 6.

Specifically, an image acquisition device 10 may be utilized in acquiring the image of the second scale pattern 6 and sending the image of the second scale pattern 6 to an image processing device 11.

For example, the image acquisition device 10 comprises a transmitting device and a receiving device. The transmitting device is used for transmitting optical signal to the second scale pattern 6. The receiving device is used for receiving the optical signal reflected by the second scale pattern 6, and transmitting the optical signal reflected by the second scale pattern 6 to the image processing device 11.

Step 2, according to the image of the second scale pattern 6, determining a distance between the edge of the second film 8 covering the second scale pattern 6 and the edge of the substrate 1.

Specifically, the distance between the edge of the second film 8 covering the second scale pattern 6 and the edge of the substrate 1 is determined by using the image processing device 11 according to the image of the second scale pattern 6 acquired by the image acquisition device 10.

When a signal received by the image processing device 11 is an optical signal reflected by the second scale pattern 6, a reflectivity of an area of second scale pattern 6 which is covered with the second film 8 is different from a reflectivity of an area of second scale pattern 6 which is not covered with the second film 8. Therefore, the image processing device device 11 may obtain the distance between the edge of the second film 8 and the edge of the substrate 1 according to the reflectivity of different areas on the second scale pattern 6.

It should be noted that the image processing device 11 may be a single chip microcomputer, and may also be a micro-control device, or, of course, other image processing devices.

Figure 9:
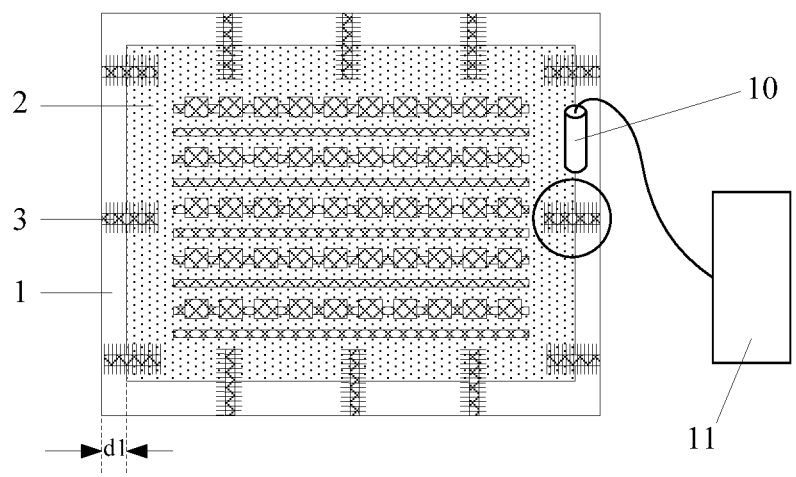
FIG. 9 is a schematic diagram of a detection method according to an embodiment of the present disclosure.

Further, as shown in FIG. 9, the detection method is further used for detecting a position of a first film 2. Namely, the method may further comprise the following step:

after a first scale pattern 3 is formed on the first film 2, acquiring an image of the first scale pattern 3 and determining a distance between the edge of the first film 2 covered by the first scale pattern 3 and the edge of the substrate 1 according to the image of the first scale pattern 3.

Specifically, an image acquisition device 10 may be utilized in acquiring an image of the first scale pattern 3 and sending the image of the first scale pattern 3 to an image processing device 11. The image processing device 11 may determine the distance between the edge of the first film 2 covered by the first scale pattern 3 and the edge of the substrate 1 according to the image of the first scale pattern 3.

When the image processing device 11 receives an optical signal which is reflected by the first scale pattern 3 and is acquired by an receiving device, a reflectivity of an area of the first scale pattern 3 covered with the first film 2 is different from a reflectivity of an area of the first scale pattern 3 not covered with the first film 2. Therefore, the image processing device 11 may obtain the distance between the edge of the first film 2 and the edge of the substrate 1 according to the reflectivity of different areas on the first scale pattern 3.

Similarly, the detection method as described above may also be applied to an array substrate motherboard provided in the embodiments described with FIGS. 3 and 4.

A method for fabricating an array substrate motherboard, an array substrate motherboard and a detection method are provided in the present disclosure. The method for fabricating an array substrate motherboard comprises: depositing a first film on a substrate, wherein a first gap is present between the edge of the first film and the edge of the substrate; coating photoresist on the substrate on which the first film is deposited; and exposing and developing the photoresist to form a first scale pattern from the photoresist, wherein one end of the first scale pattern is flush with the edge of the substrate and the other end covers the first film. According to the embodiments of the present disclosure, the distance between the edge of the first film and the edge of the substrate may be read out through the first scale pattern. Compared with a manual measurement method, the measurement efficiency is higher, and time and labor are saved. Moreover, the precision of the first scale pattern formed by a photolithography process is micron-level, and compared with a millimeter-level graduated scale, the measuring precision is higher and the measuring deviation is smaller.

It is to be understood that the above embodiments are merely exemplary embodiments adopted to illustrate the principles of the present disclosure, but the present disclosure is not limited thereto. For those skilled in the art, various variations and improvements may be made without departing from the spirit and essence of the present disclosure, and these variations and improvements are also considered within the protection scope of the present disclosure.

What is claimed is:

1. A method for fabricating an array substrate motherboard, comprising:
   depositing a first film on a substrate, wherein a first gap is between an edge of the first film and an edge of the substrate;
   coating a photoresist on the substrate on which the first film is deposited; and
   exposing and developing the photoresist to form a first scale pattern by the photoresist,
   wherein a first end of the first scale pattern is flush with the edge of the substrate and a second end of the first scale pattern is on the first film.

2. The method for fabricating an array substrate motherboard according to claim 1,
   wherein the first film comprises a metallic film.

3. The method for fabricating an array substrate motherboard according to claim 2, wherein the exposing and developing the photoresist comprises:
   forming a first photolithographic pattern by the photoresist, and
   forming the first scale pattern by the photoresist.

4. The method for fabricating an array substrate motherboard according to claim 3,
   wherein the first photolithographic pattern is in a display area of the substrate.

5. The method for fabricating an array substrate motherboard according to claim 3, wherein after the first scale pattern and the first photolithographic pattern are formed by the photoresist, the method further comprises:
   removing a portion of the first film which is not covered by the first scale pattern and the first photolithographic pattern by etching; and
   stripping the first scale pattern and the first photolithographic pattern to form a second scale pattern and a first pattern.

6. The method for fabricating an array substrate motherboard according to claim 5, wherein the first pattern comprises a gate pattern.

7. The method for fabricating an array substrate motherboard according to claim 5, wherein after the second scale pattern and the first pattern are formed, the method further comprises:
   depositing a second film on a surface of the substrate on which the second scale pattern and the first pattern are formed,
   wherein a second gap is between the edge of the second film and the edge of the substrate,
   wherein the second gap is larger than the first gap, and
   wherin the second film partially covers the second scale pattern.

8. The method for fabricating an array substrate motherboard according to claim 7, wherein the second film comprises a non-metallic film.

9. The method for fabricating an array substrate motherboard according to claim 7,
   wherein both the first scale pattern and the second scale pattern comprise a plurality of scale lines, and
   wherein the plurality of scale lines are at equal intervals along a direction perpendicular to the edge of the substrate.

10. The method for fabricating an array substrate motherboard according to claim 9, wherein a distance between two adjacent ones of the plurality of scale lines is 1-20 μm.

11. The method for fabricating an array substrate motherboard according to claim 9,
    wherein both the first scale pattern and the second scale pattern comprise a plurality of scale values, and
    wherein the plurality of scale values are respectively at a side of the plurality of scale lines.

12. The method for fabricating an array substrate motherboard according to claim 11,
    wherein a scale value of the plurality of scale values corresponding to a scale line of the plurality of scale lines which is flush with the edge of the substrate is 0.

13. The method for fabricating an array substrate motherboard according to claim 4, wherein after the first scale pattern and the first photolithographic pattern are formed by the photoresist, the method further comprising:
    removing the first film which is not covered by the first scale pattern and the first photolithographic pattern by etching; and
    stripping the first scale pattern and the first photolithographic pattern to form a second scale pattern and a first pattern.

* * * * *